United States Patent
Oh et al.

(10) Patent No.: US 9,575,112 B2
(45) Date of Patent: Feb. 21, 2017

(54) TEST SYSTEM THAT PERFORMS SIMULTANEOUS TESTS OF MULTIPLE TEST UNITS

(71) Applicant: SAMSUNG ELECTRONICS CO., LTD., Gyeonggi-do (KR)

(72) Inventors: In-Wook Oh, Suwon-si (KR); Chin Kim, Seongnam-si (KR); Sunhom Steve Paak, Seoul (KR); Jae-Seok Yang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 150 days.

(21) Appl. No.: 14/673,490

(22) Filed: Mar. 30, 2015

(65) Prior Publication Data

US 2016/0047853 A1    Feb. 18, 2016

(30) Foreign Application Priority Data

Aug. 18, 2014  (KR) ........................ 10-2014-0107246

(51) Int. Cl.
| | |
|---|---|
| *G01R 31/36* | (2006.01) |
| *G01R 31/26* | (2014.01) |
| *G01R 31/3185* | (2006.01) |
| *G01R 31/317* | (2006.01) |
| *G01R 31/319* | (2006.01) |

(52) U.S. Cl.
CPC ....... *G01R 31/2607* (2013.01); *G01R 31/2601* (2013.01); *G01R 31/31722* (2013.01); *G01R 31/318511* (2013.01); *G01R 31/31926* (2013.01)

(58) Field of Classification Search
CPC .............................................. G01R 31/31722
USPC ................................................ 324/750.15
See application file for complete search history.

(56) References Cited

U.S. PATENT DOCUMENTS

| | | | |
|---|---|---|---|
| 7,046,026 B2 | 5/2006 | Chao et al. | |
| 7,071,717 B2 | 7/2006 | Hoke et al. | |
| 7,405,585 B2 | 7/2008 | Doong | |
| 7,512,509 B2 | 3/2009 | Bhushan et al. | |
| 7,622,942 B2 | 11/2009 | Agarwal et al. | |
| 7,730,371 B2 | 6/2010 | Fujibe et al. | |
| 7,902,852 B1 | 3/2011 | Hess et al. | |
| 8,112,736 B2 | 2/2012 | Garcia, II et al. | |
| 8,178,876 B2 | 5/2012 | Hess et al. | |
| 8,687,435 B2 | 4/2014 | Gatzemeier et al. | |
| 2016/0069950 A1* | 3/2016 | Chen ................. | G01R 31/2855 324/750.05 |

* cited by examiner

*Primary Examiner* — Hoai V Ho
(74) *Attorney, Agent, or Firm* — Myers Bigel, P.A.

(57) ABSTRACT

A test system includes row decoder, column decoder, row test controller, and test circuit. The row decoder activates one of first through M-th row signals based on plurality of row input signals. The column decoder activates one of first through N-th column signals based on plurality of column input signals. The row test controller outputs first through N-th column output signals, which are activated, when row test enable signal is activated. The row test controller outputs the first through N-th column signals as the first through N-th column output signals respectively when the row test enable signal is deactivated. The test circuit includes first through M-th row test blocks, each of which includes first through N-th test units. The test circuit simultaneously performs short test of the first through N-th test units included in row test block when the row test enable signal is activated.

13 Claims, 14 Drawing Sheets

TEST SYSTEM THAT PERFORMS SIMULTANEOUS TESTS OF MULTIPLE TEST UNITS

CROSS-REFERENCE TO RELATED APPLICATION

This U.S. Non-provisional application claims priority under 35 USC §119 to Korean Patent Application No. 10-2014-0107246, filed on Aug. 18, 2014, in the Korean Intellectual Property Office (KIPO), the disclosure of which is incorporated by reference in its entirety herein.

BACKGROUND

1. Technical Field

Example embodiments relate generally to test systems, and more particularly to test systems that can test a plurality of test units.

2. Discussion of the Related Art

As manufacturing processes of semiconductors have been developed, design rules to design semiconductor may increase. The design rules are verified through test units having various layout patterns on a silicon wafer. The number of pads which transfer signals between test units and outside of a test system including the test units is relatively small compared to the number of the test units.

SUMMARY

According to example embodiments, a test system includes a row decoder, a column decoder, a row test controller, and a test circuit. The row decoder activates one of first through M-th row signals, where M is a positive integer 1, 2, 3 . . . , based on a plurality of row input signals. The column decoder activates one of first through N-th column signals, where N is a positive integer, based on a plurality of column input signals. The row test controller outputs first through N-th column output signals, which are activated, when a row test enable signal is activated. The row test controller outputs the first through N-th column signals as the first through N-th column output signals respectively when the row test enable signal is deactivated. The test circuit includes first through M-th row test blocks, each of which includes first through N-th test units. The first through M-th row test blocks correspond to the first through M-th row signals, respectively. The test circuit simultaneously performs a short test of the first through N-th test units included in a row test block, which corresponds to activated row signal among the first through M-th row signals, based on first and second test signals and the first through N-th column output signals when the row test enable signal is activated.

In an example embodiment, the test circuit may perform short test of a test unit, which corresponds to the activated row signal among the first through M-th row signals and activated column output signal among the first through N-th column output signals, based on the first and second test signals when the row test enable signal is deactivated.

In an example embodiment, a result of the short test of the first through N-th test units may represent success when an input current is applied as the first test signal and the input current is not measured as the second test signal, and the result of the short test of the first through N-th test units may represent failure when the input current is applied as the first test signal and the input current is measured as the second test signal.

In an example embodiment, if the result of the short test of the first through N-th test units represents failure, the row test enable signal may be deactivated and the test circuit may separately perform the short test of each of the first through N-th test units included in the row test block, which corresponds to the activated row signal among the first through M-th row signals, again.

In an example embodiment, the K-th row test block, where K is a positive integer equal to or less than M, may include a row switch and first through N-th column switches. The first test signal may be applied to a first terminal of the row switch, a second terminal of the row switch may be connected to a first node, and the first and second terminals of the row switch may be connected or disconnected based on the K-th row signal. The second test signal may be output from a second node, first terminals of the first through N-th column switches may be connected to the second node, second terminals of the first through N-th column switches may be connected to the first node through the first through N-th test units respectively, and the first and second terminals of each of the first through N-th column switches may be connected or disconnected based on each of the first through N-th column output signals.

In an example embodiment, the row switch and the first through N-th column switches may include a pass transistor, respectively.

In an example embodiment, the K-th row test block, where K is a positive integer equal to or less than M, may include a row switch and first through 2N-th column switches. The first test signal may be applied to a first terminal of the row switch, a second terminal of the row switch may be connected to a first node, and the first and second terminals of the row switch may be connected or disconnected based on the K-th row signal. The second test signal may be output from a second node, first terminals of the first through N-th column switches may be connected to the second node, second terminals of the first through N-th column switches may be connected to first terminals of the N+1-th through 2N-th column switches through the first through N-th test units respectively, second terminals of the N+1-th through 2N-th column switches may be connected to the first node, the first and second terminals of each of the first through N-th column switches may be connected or disconnected based on each of the first through N-th column output signals, and the first and second terminals of each of the N+1-th through 2N-th column switches may be connected or disconnected based on each of the first through N-th column output signals.

In an example embodiment, the row switch and the first through 2N-th column switches may include a pass transistor, respectively.

In an example embodiment, the test system may be embodied on a silicon substrate. The test system may include a plurality of row input signal metals, first and second test signal metals, row test enable signal metal, and a plurality of column input signal metals on the silicon substrate.

In an example embodiment, an insulation layer may be on the silicon substrate. The insulation layer may include a plurality of row input signal pads, first and second test signal pads, a row test enable signal pad, and a plurality of column input signal pads on the insulation layer. The insulation layer may include first connection metals connecting the row input signal pads and the row input signal metals respectively, a second connection metal connecting the first test signal pad and the first test signal metal, a third connection metal connecting the second test signal pad and the second test signal metal, a fourth connection metal connecting the row test enable signal pad and the row test enable signal metal, and fifth connection metals connecting the column input signal pads and the column input signal metals. The row input signals may be provided to the row decoder through the row input signal pads, the first connection metals, and the row input signal metals, respectively. The column input signals may be provided to the column decoder through the column input signal pads, the fifth connection metals, and the column input signal metals, respectively. The row test enable signal may be provided to the row test controller through the row test enable signal pad, the fourth connection metal, and the row test enable signal metal. The first test signal generated by an external current source may be provided to the test circuit through the first test signal pad, the second connection metal, and the first test signal metal. The second test signal generated by the test circuit may be provided to an external current measurement circuit through the second test signal metal, the third connection metal, and the second test signal pad.

In an example embodiment, the row test controller may include first through N-th OR gates. Each of the first through N-th OR gates may generate each of the first through N-th column output signals by performing logic OR operation on the row test enable signal and each of the first through N-th column signals.

According to example embodiments, a test system includes a row decoder, a column decoder, and a test circuit. The row decoder activates one of first through M-th row signals, where M is a positive integer based on a plurality of row input signals. The column decoder activates one of signals, which includes a row test enable signal and first through N-th column signals, where N is a positive number, based on a plurality of column input signals. The test circuit includes first through M-th row test blocks, each of which includes first through N-th test units. The first through M-th row test blocks correspond to the first through M-th row signals, respectively. The test circuit simultaneously performs an open test of the first through N-th test units included in a row test block, which corresponds to activated row signal among the first through M-th row signals, based on first and second test signals and the first through N-th column signals when the row test enable signal is activated.

In an example embodiment, the test circuit may perform an open test of a test unit, which corresponds to the activated row signal among the first through M-th row signals and activated column signal among the first through N-th column signals, based on the first and second test signals when the row test enable signal is deactivated.

In an example embodiment, a result of the open test of the first through N-th test units may represent success when an input current is applied as the first test signal and the input current is measured as the second test signal. The result of the open test of the first through N-th test units may represent failure when the input current is applied as the first test signal and the input current is not measured as the second test signal.

In an example embodiment, if the result of the open test of the first through N-th test units represents failure, the row test enable signal may be deactivated and the test circuit may separately perform the open test of each of the first through N-th test units included in the row test block, which corresponds to the activated row signal among the first through M-th row signals, again.

In an example embodiment, the K-th row test block, where K is a positive integer equal to or less than M, may include first through third row switches and first through 2N-th column switches. The first test signal may be applied to a first terminal of the first row switch, a second terminal of the first row switch may be connected to a first node, the first and second terminals of the first row switch may be connected or disconnected based on the K-th row signal. A first terminal of the L+1-th test unit, where L is a positive integer less than N, may be connected to a second terminal of the L-th test unit. A first terminal of the second row switch may be connected to the first node, a second terminal of the second row switch may be connected to a first terminal of the first test unit, and the first and second terminals of the second row switch may be connected or disconnected based on the row test enable signal. A first terminal of the third row switch may be connected to a second terminal of the N-th test unit, a second terminal of the third row switch may be connected to a second node, the second test signal may be output from the second node, and the first and second terminals of the third row switch may be connected or disconnected based on the row test enable signal. First terminals of the first through N-th column switches may be connected to the second node, second terminals of the first through N-th column switches may be connected to the second terminals of the first through N-th test units respectively, and the first and second terminals of each of the first through N-th column switches may be connected or disconnected based on each of the first through N-th column signal. First terminals of the N+1-th through 2N-th column switches may be connected to the first node, second terminals of the N+1-th through 2N-th column switches are connected to the first terminals of the first through N-th test units respectively, and the first and second terminals of each of the N+1-th through 2N-th column switches are connected or disconnected based on each of the first through N-th column signal.

In an example embodiment, the first through third row switches and the first through 2N-th column switches may include a pass transistor, respectively.

In an example embodiment, the test system may be embodied on a silicon substrate. The test system may include a plurality of row input signal metals, first and second test signal metals, and a plurality of column input signal metals on the silicon substrate.

In an example embodiment, an insulation layer may be on the silicon substrate. The insulation layer may include a plurality of row input signal pads, first and second test signal pads, and a plurality of column input signal pads on a surface of the insulation layer. The insulation layer may include first connection metals connecting the row input signal pads and the row input signal metals respectively, a second connection metal connecting the first test signal pad and the first test signal metal, a third connection metal connecting the second test signal pad and the second test signal metal, and fourth connection metals connecting the column input signal pads and the column input signal metals. The row input signals may be provided to the row decoder through the row input signal pads, the first connection metals, and the row input signal metals, respectively. The column input signals may be provided to the column decoder through the column input signal pads, the fourth connection metals, and the column input signal metals, respectively. The first test signal generated by an external current source may be provided to the test circuit through the first test signal pad, the second connection metal, and the first test signal metal. The second test signal generated by the test circuit may be provided to an external current measurement circuit through the second test signal metal, the third connection metal, and the second test signal pad.

In an example embodiment, a test system may include a test circuit including a plurality of test blocks, a respective one of which includes a plurality of test units. The test circuit is configured to simultaneously perform a test on a plurality of test units in one of the plurality of test blocks and, upon failure of all the test units to pass the test that is performed simultaneously, to separately perform the test on a respective one of the plurality of test units in the one of the plurality of test blocks.

In example embodiments, the test is a short test that represents failure when a current is applied to a first node of the test unit and the current is measured at a second node of the test unit.

In example embodiments, the test is an open test that represents failure when a current is applied to a first node of the test unit and the current is not measured at a second node of the test unit.

In example embodiments, the test circuit is embodied on a single silicon substrate. In some embodiments, the plurality of test units comprise a plurality of layout patterns in the single silicon substrate, at least two of which include different design rules.

As described above, the test system according to example embodiments changes 2D addressable test site, which tests a plurality of test units selected by row signals and column signals for using relatively small pads efficiently, such that short tests or open tests of the test units included in a row may be performed simultaneously based on a row test enable signal, and test time of the test units may be reduced.

BRIEF DESCRIPTION OF THE DRAWINGS

Example embodiments of the inventive concepts will be more clearly understood from the following detailed description taken in conjunction with the accompanying drawings.

DETAILED DESCRIPTION OF THE EMBODIMENTS

Figure 1:
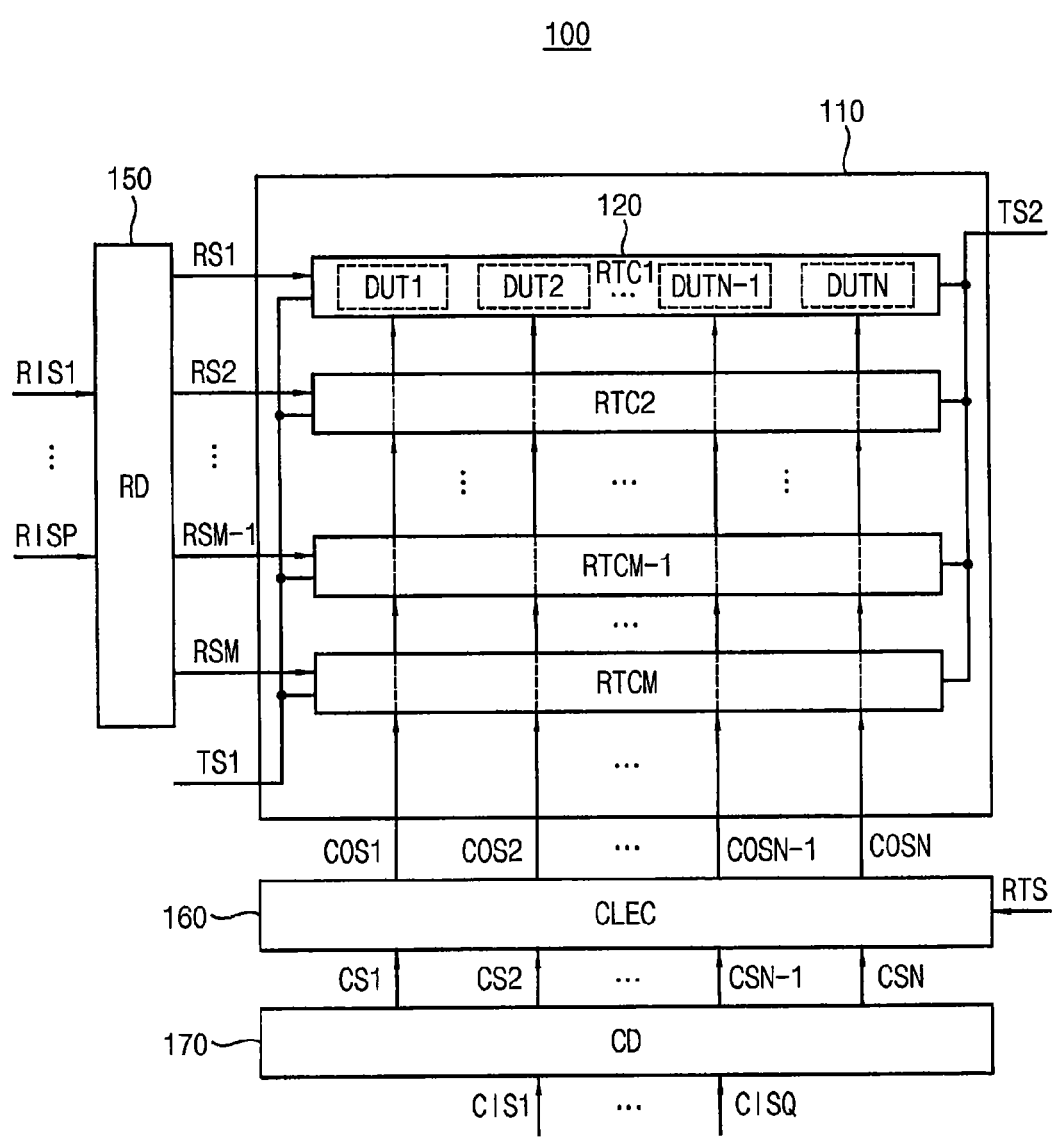
FIG. 1 is a block diagram illustrating a test system according to an example embodiment.

Various example embodiments will be described more fully hereinafter with reference to the accompanying drawings, in which some example embodiments are shown. The present inventive concepts may, however, be embodied in many different forms and should not be construed as limited to the example embodiments set forth herein. Rather, these example embodiments are provided so that this disclosure will be thorough and complete, and will fully convey the scope of the present inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concepts. As used herein, the term "and/or" includes any and all combinations of one or more of the associated listed items.

It will be understood that when an element is referred to as being "connected" or "connected" to another element, it can be directly connected or connected to the other element or intervening elements may be present. In contrast, when an element is referred to as being "directly connected" or "directly connected" to another element, there are no intervening elements present. Other words used to describe the relationship between elements should be interpreted in a like fashion (e.g., "between" versus "directly between," "adjacent" versus "directly adjacent," etc.).

It also will be understood that, as used herein, the terms "row" and "column" indicate two non-parallel directions that may be orthogonal to one another. However, the terms row and column do not indicate a particular horizontal or vertical orientation.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a test system according to an example embodiment.

Referring to FIG. 1, a test system 100 includes a row decoder RD 150, a column decoder CD 170, a row test controller CLEC 160, and a test circuit 110. The test circuit 110 includes first through M-th row test blocks RTC1 (120), RTC2 through RTCM−1, RTCM, each of which includes first through N-th test units DUT1, DUT2 through DUTN−1, DUTN.

In some embodiments, the test units are two-terminal layout patterns in a silicon semiconductor wafer, wherein the configuration and/or dimensions of the layout pattern may vary depending upon the design rules that are used. A given test unit may be duplicated in the test circuit, to allow statistical testing. Moreover, a variety different test units may be provided, which may have a similar pattern but different design rules, which may have different patterns and the same design rules and/or may have different patterns and different design rules. In order to verify the design rules, large numbers of test units may be provided. In the Figures, the test units may be represented schematically by a resistor because, in some embodiments, the test units may be represented by line patterns having a resistance. However, more complex test units also may be provided.

The row decoder 150 activates one of first through M-th row signals RS1, RS2 through RSM−1, RSM based on a plurality of row input signals RIS1 through RISP. M is a positive integer, i.e., 1, 2, 3, 4 . . . . The column decoder 170 activates one of first through N-th column signals CS1, CS2 through CSN−1, CSN based on a plurality of column input signals CIS1 through CISQ. N is a positive integer. The row test controller 160 outputs first through N-th column output signals COS1, COS2 through COSN−1, COSN, which are activated, when a row test enable signal RTS is activated. The row test controller 160 outputs the first through N-th column signals CS1, CS2 through CSN−1, CSN as the first through N-th column output signals COS1, COS2 through COSN−1, COSN respectively when the row test enable signal RTS is deactivated.

The first through M-th row test blocks RTC1 (120), RTC2 through RTCM−1, RTCM correspond to the first through M-th row signals RS1, RS2 through RSM−1, RSM, respectively. The test circuit 110 simultaneously performs short test of the first through N-th test units included in a row test block, which corresponds to activated row signal among the first through M-th row signals RS1, RS2 through RSM−1, RSM, based on first and second test signals TS1, TS2 and the first through N-th column output signals COS1, COS2 through COSN−1, COSN when the row test enable signal RTS is activated.

The test circuit 110 may perform short test of a test unit, which corresponds to the activated row signal among the first through M-th row signals RS1, RS2 through RSM−1, RSM and activated column output signal among the first through N-th column output signals COS1, COS2 through COSN−1, COSN, based on the first and second test signals TS1, TS2 when the row test enable signal RTS is deactivated.

Figure 17:
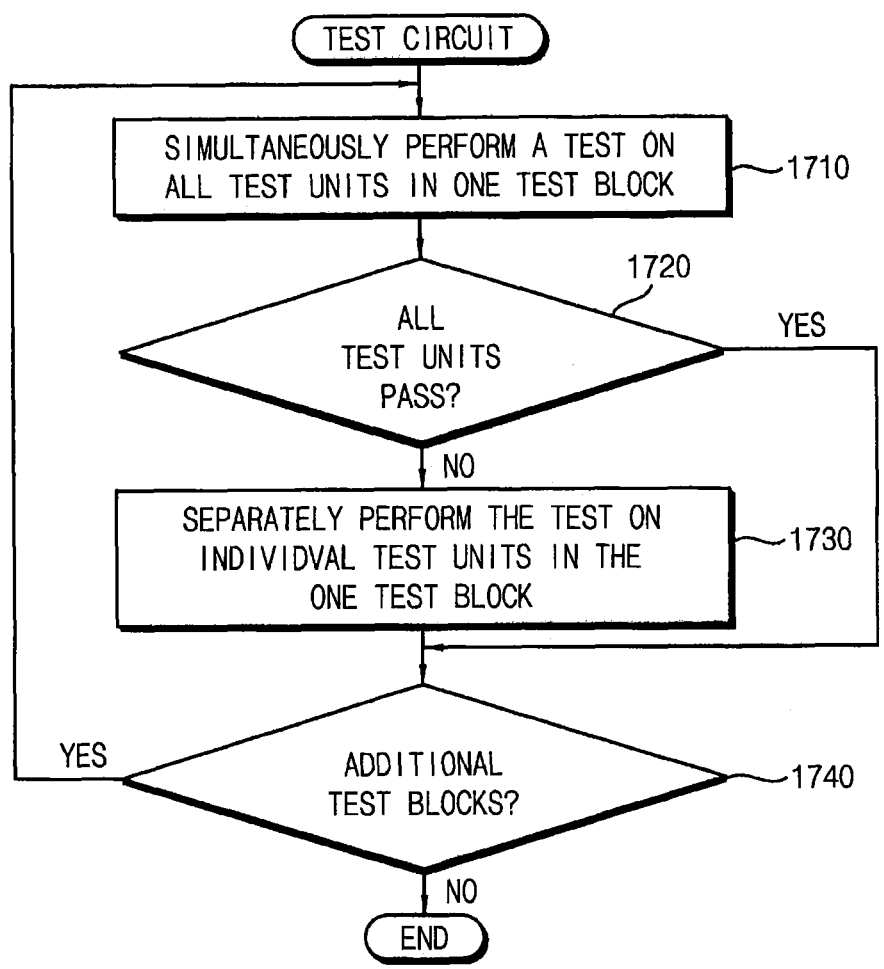
FIG. 17 is a flowchart of operations of a test system according to example embodiments.

FIG. 17 is a flowchart illustrating operation of a test circuit, such as the test circuit 110, according to various embodiments. Referring to FIG. 17, at Block 1710, a test is simultaneously performed on all test units in one test block, such as a test block 120 of FIG. 1. If all test units in the one test block pass the test, then a determination is made at Block 1740 as to whether additional test blocks have not yet been tested. If so, they are tested by returning operations to Block 1710. Alternatively, if all of the test units do not pass the test at Block 1720, then at Block 1730, the test is separately performed on the individual test units in the one test block. Accordingly, in FIG. 17, the test circuit 110 is configured to simultaneously perform a test on a plurality of test units DUT in one of the plurality of test blocks 120 and, upon failure of all the test units DUT to pass the test that is performed simultaneously, to separately perform the test on a respective one of the plurality of test units DUT in the one of the plurality of test blocks 120. The plurality of test units may comprise a plurality of layout patterns in the single silicon substrate, at least two of which include different design rules.

A procedure of simultaneous short test of the first through N-th test units DUT1, DUT2 through DUTN−1, DUTN and a procedure of separate short test of the first through N-th test units DUT1, DUT2 through DUTN−1, DUTN will be described with the references to FIGS. 2 and 3.

Figure 2:
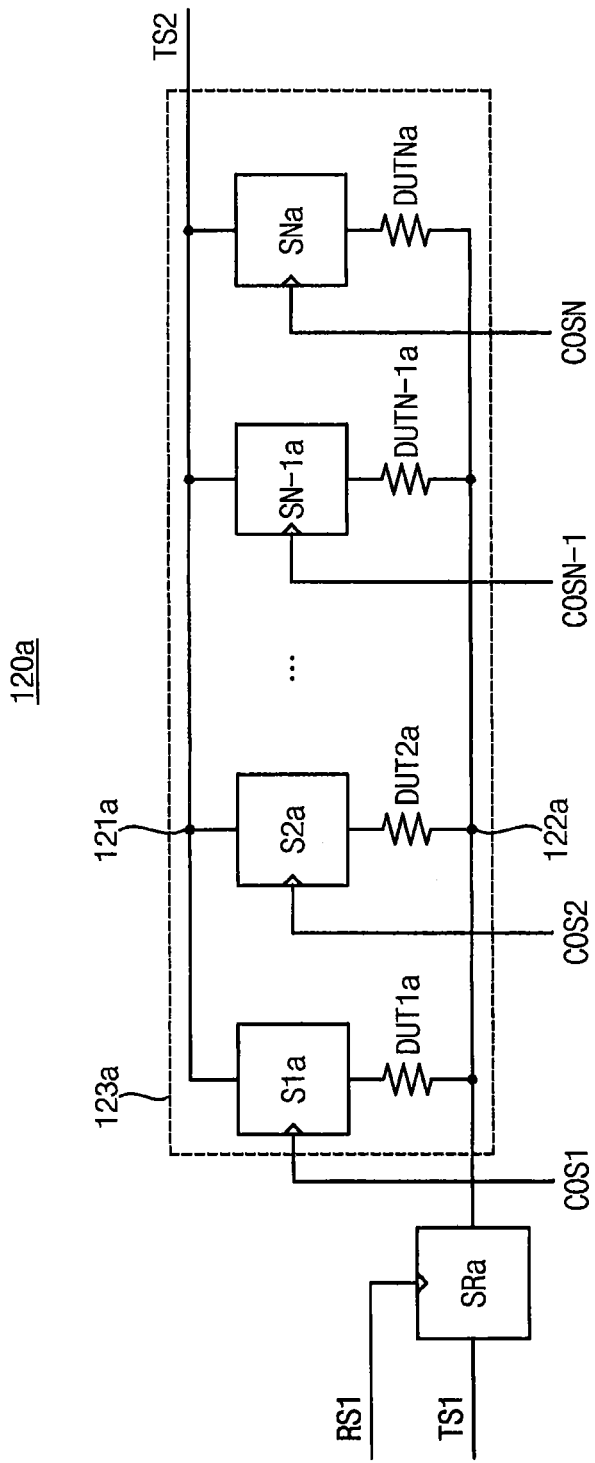
FIG. 2 is a block diagram illustrating the first row test block included in the test system of FIG. 1.

FIG. 2 is a block diagram illustrating the first row test block included in the test system of FIG. 1.

Referring to FIG. 2, the first row test block 120a may include a row switch SRa and first through N-th column switches S1a S2a through SN−1a, SNa. The second through M-th row test block RTC2, RTCM−1, RTCM included in the test system 100 of FIG. 1 may have the same or similar structure with the first row test block 120a.

The first test signal TS1 may be applied to a first terminal of the row switch SRa. A second terminal of the row switch SRa may be connected to a first node 122a. The first and second terminals of the row switch SRa may be connected or disconnected based on the first row signal RS1. The second test signal TS2 may be output from a second node 121a. First terminals of the first through N-th column switches S1a, S2a through SN−1a, SNa may be connected to the second node 121a. Second terminals of the first through N-th column switches S1a, S2a through SN−1a, SNa may be connected to the first node 122a through the first through N-th test units DUT1a, DUT2a through DUTN−1a, DUTNa respectively. The first and second terminals of each of the first through N-th column switches S1a, S2a through SN−1a, SNa may be connected or disconnected based on each of the first through N-th column output signals COS1, COS2 through COSN−1, COSN.

The first and second terminals of the row switch SRa may be connected (shorted) when the first row signal RS1 is activated. The first and second terminals of the row switches SRa may be disconnected (opened) when the first row signal RS1 is deactivated. The first and second terminals of each of the first through N-th column switches S1a, S2a through SN−1a, SNa may be connected when each of the first through N-th column output signals COS1, COS2 through COSN−1, COSN is activated. The first and second terminals of each of the first through N-th column switches S1a, S2a through SN−1a, SNa may be disconnected when each of the first through N-th column output signals COS1, COS2 through COSN−1, COSN is deactivated.

In an example embodiment, the first through N-th test units DUT1a, DUT2a through DUTN−1a, DUTNa may have the same circuit structure, but may have different layout patterns. Example embodiments of layouts of the first through N-th test units DUT1a, DUT2a through DUTN−1a, DUTNa will be described with the references to FIGS. 4 through 7.

Two terminals of the row switch SRa are connected (shorted) and two terminals of each of the first through N-th column switches SR1a, SR2a through SRN−1a, SRNa are connected when the first row signal RS1 is activated and activated row test enable signal RTS is applied to the row test controller 160. If the input current is applied as the first test signal TS1 and the input current is not measured as the second test signal TS2, two terminals of each of the first through N-th test units DUT1a, DUT2a through DUTN−1a, DUTNa are disconnected, and the result of the short test of the first through N-th test units DUT1a, DUT2a through DUTN−1a, DUTNa represents success. In other words, the fact that all of the first through N-th test units DUT1a, DUT2a through DUTN−1a, DUTNa are opened may be indicated by one test.

If the input current is applied as the first test signal TS1 and the input current is measured as the second test signal TS2, two terminals of at least one of the first through N-th test units DUT1a, DUT2a through DUTN−1a, DUTNa are connected, and the result of the short test of the first through N-th test units DUT1a, DUT2a through DUTN−1a, DUTNa represents failure. In other words, the fact that not all of the first through N-th test units DUT1a, DUT2a through DUTN−1a, DUTNa are opened may be indicated. In this case, the test circuit 110 separately performs short test of each of the first through N-th test units DUT1a, DUT2a through DUTN−1a, DUTNa again by deactivating the row test enable signal RTS, activating the first through N-th column output signals COS1, COS2 through COSN−1, COSN sequentially.

Two terminals of the row switch SRa are connected, two terminals of the first column switch S1a are connected, and two terminals of each of other column switches S2a through SN−1a, SNa are disconnected when the first row signal RS1 is activated, the row test enable signal RTS is deactivated, and the first column output signal COS1 is activated. If the input current is applied as the first test signal TS1 and the input current is not measured as the second test signal TS2, two terminals of the first test unit DUT1a are disconnected. If the input current is applied as the first test signal TS1 and the input current is measured as the second test signal TS2, two terminals of the first test unit DUT1a are connected.

Two terminals of the row switch SRa are connected, two terminals of the second column switch S2a are connected, and two terminals of each of other column switches (S1a, SN−1a, and SNa) are disconnected when the first row signal RS1 is activated, the row test enable signal RTS is deactivated, and the second column output signal COS2 is activated. If the input current is applied as the first test signal TS1 and the input current is not measured as the second test signal TS2, two terminals of the second test unit DUT2a are disconnected. If the input current is applied as the first test signal TS1 and the input current is measured as the second test signal TS2, two terminals of the second test unit DUT2a are connected.

Two terminals of the row switch SRa are connected, two terminals of the N−1-th column switch SN−1a are connected, and two terminals of each of other column switches (S1a, S2a, and SNa) are disconnected when the first row signal RS1 is activated, the row test enable signal RTS is deactivated, and the N−1-th column output signal COSN−1 is activated. If the input current is applied as the first test signal TS1 and the input current is not measured as the second test signal TS2, two terminals of the N−1-th test unit DUTN−1a are disconnected. If the input current is applied as the first test signal TS1 and the input current is measured as the second test signal TS2, two terminals of the N−1-th test unit DUTN−1a are connected.

Two terminals of the row switch SRa are connected, two terminals of the N-th column switch SNa are connected, and two terminals of each of other column switches (S1a, S2a through SN−1a) are disconnected when the first row signal RS1 is activated, the row test enable signal RTS is deactivated, and the N-th column output signal COSN is activated. If the input current is applied as the first test signal TS1 and the input current is not measured as the second test signal TS2, two terminals of the N-th test unit DUTNa are disconnected. If the input current is applied as the first test signal TS1 and the input current is measured as the second test signal TS2, two terminals of the N-th test unit DUTNa are connected.

The first circuit 123a includes the first through N-th column switches S1a, S2a through SN−1a, SNa and the first through N-th test units DUT1a, DUT2a through DUTN−1a, DUTNa. The first circuit 123a will be described with the reference to FIG. 3.

Figure 3:
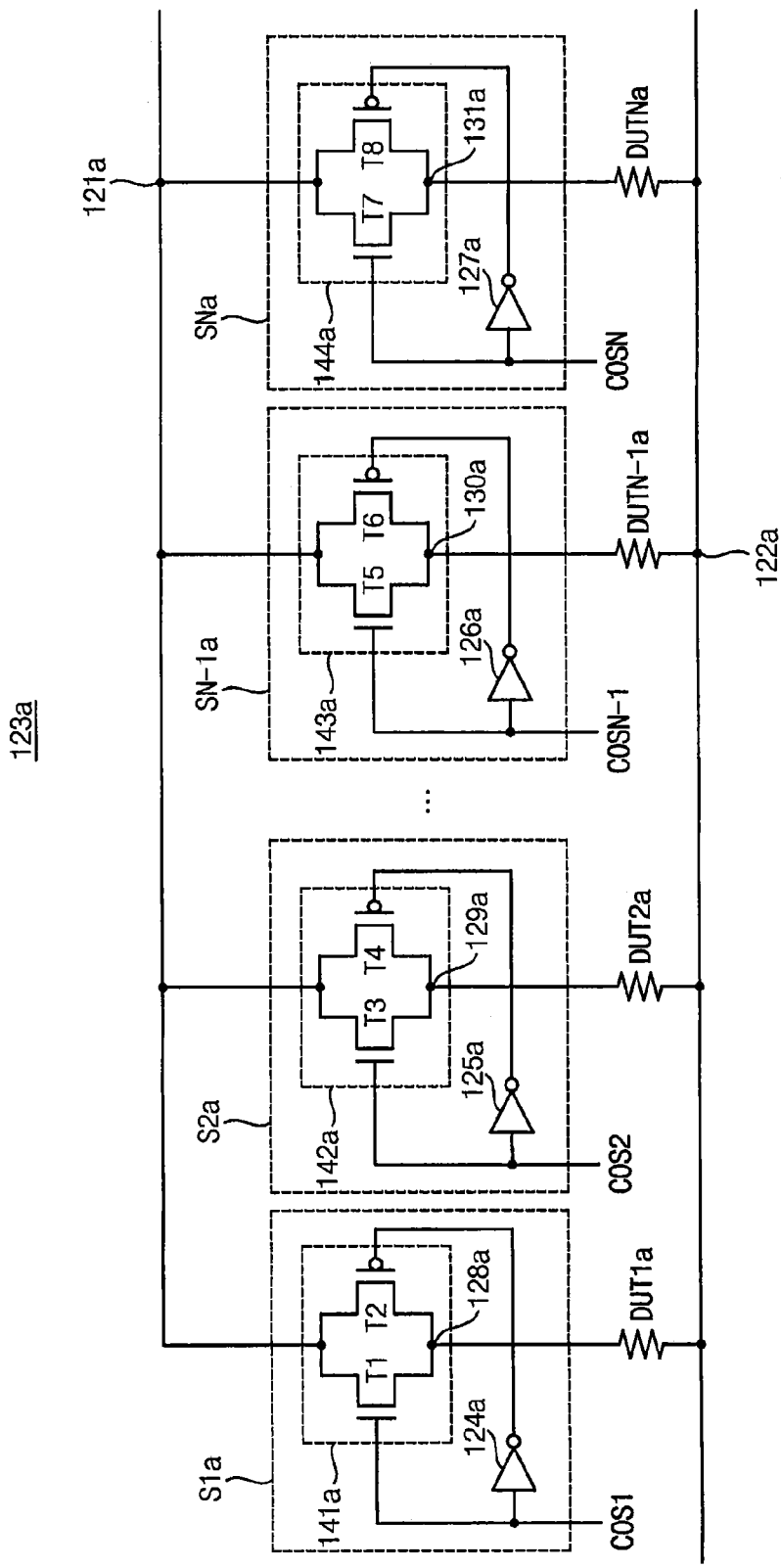
FIG. 3 is a circuit diagram illustrating an example embodiment of the first circuit included in the first row test block of FIG. 2.

FIG. 3 is a circuit diagram illustrating an example embodiment of the first circuit included in the first row test block of FIG. 2.

Referring to FIG. 3, the first column switch S1a includes a first pass transistor 141a and a first inverter 124a. The second column switch S2a includes a second pass transistor 142a and a second inverter 125a. The N−1-th column switch SN−1a includes a N−1-th pass transistor 143a and a N−1-th inverter 126a. The N-th column switch SNa includes a N-th pass transistor 144a and a N-th inverter 127a.

The first pass transistor 141a includes a first transistor T1 and a second transistor T2. The second pass transistor T2 includes a third transistor T3 and a fourth transistor T4. The N−1-th pass transistor 143a includes a fifth transistor T5 and a sixth transistor T6. The N-th pass transistor 144a includes a seventh transistor T7 and a eighth transistor T8.

The first inverter 124a generates an inverted first column output signal by inverting the first column output signal COS1. A drain terminal of the first transistor T1 is connected to a second node 121a, a gate terminal of the first transistor T1 receives the first column output signal COS1, and a source terminal of the first transistor T1 is connected to a third node 128a. A drain terminal of the second transistor T2 is connected to the second node 121a, a gate terminal of the second transistor T2 receives the inverted first column output signal, and a source terminal of the second transistor T2 is connected to the third node 128a. A first terminal of the first test unit DUT1a is connected to the third node 128a, and a second terminal of the first test unit DUT1a is connected to a first node 122a.

The second inverter 125a generates an inverted second column output signal by inverting the second column output signal COS2. A drain terminal of the third transistor T3 is connected to the second node 121a, a gate terminal of the third transistor T3 receives the second column output signal COS2, and a source terminal of the third transistor T3 is connected to a fourth node 129a. A drain terminal of the fourth transistor T4 is connected to the second node 121a, a gate terminal of the fourth transistor T4 receives the inverted second column output signal, and a source terminal of the fourth transistor T4 is connected to the fourth node 129a. A first terminal of the second test unit DUT2a is connected to the fourth node 129a, and a second terminal of the second test unit DUT2a is connected to the first node 122a.

The N−1-th inverter 126a generates an inverted N−1-th column output signal by inverting the N−1-th column output signal COSN−1. A drain terminal of the fifth transistor T5 is connected to the second node 121a, a gate terminal of the fifth transistor T5 receives the N−1-th column output signal COSN−1, and a source terminal of the fifth transistor T5 is connected to a fifth node 130a. A drain terminal of the sixth transistor T6 is connected to the second node 121a, a gate terminal of the sixth transistor T6 receives the inverted N−1-th column output signal, and a source terminal of the sixth transistor T6 is connected to the fifth node 130a. A first terminal of the N−1-th test unit DUTN−1a is connected to the fifth node 130a, and a second terminal of the N−1-th test unit DUTN−1a is connected to the first node 122a.

The N-th inverter 127a generates an inverted N-th column output signal by inverting the N-th column output signal COSN. A drain terminal of the seventh transistor T7 is connected to the second node 121a, a gate terminal of the seventh transistor T7 receives the N-th column output signal COSN, and a source terminal of the seventh transistor T7 is connected to a sixth node 131a. A drain terminal of the eighth transistor T8 is connected to the second node 121a, a gate terminal of the eighth transistor T8 receives the inverted N-th column output signal, and a source terminal of the eighth transistor T8 is connected to the sixth node 131a. A first terminal of the N-th test unit DUTNa is connected to the sixth node 131a, and a second terminal of the N-th test unit DUTNa is connected to the first node 122a.

FIGS. 4 through 7 are diagrams illustrating example embodiments of layouts of the first, second, N−1-th, and N-th test units included in the first row test block of FIG. 2. These layouts show the same layout pattern, but have different design rules among the layout pattern.

Figure 4:
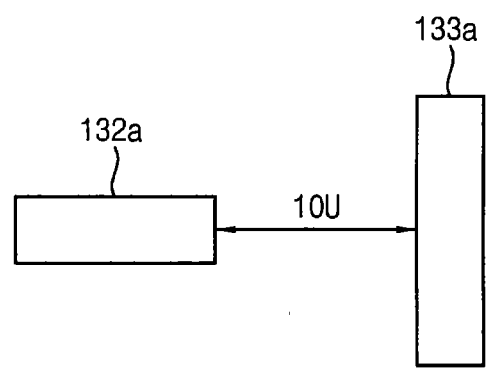
FIGS. 4 through 7 are diagrams illustrating example embodiments of layouts of the first, second, N–1-th, and N-th test units included in the first row test block of FIG. 2.

FIG. 4 shows an example embodiment of layout of the first test unit DUT1a. A first metal 132a is connected to the first node 122a. A second metal 133a is connected to the third node 128a. Distance between the first metal 132a and the second metal 133a is 10 U (Units).

Figure 5:
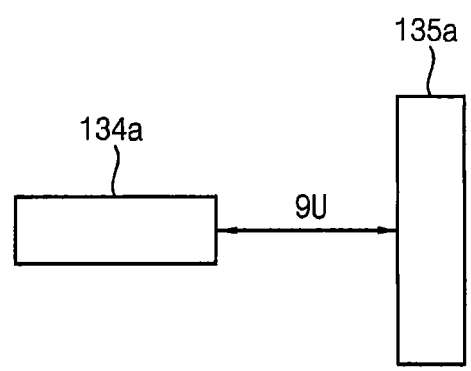

FIG. 5 shows an example embodiment of layout of the second test unit DUT2a. A third metal 134a is connected to the first node 122a. A fourth metal 135a is connected to the fourth node 129a. Distance between the third metal 134a and the fourth metal 135a is 9 U.

Figure 6:
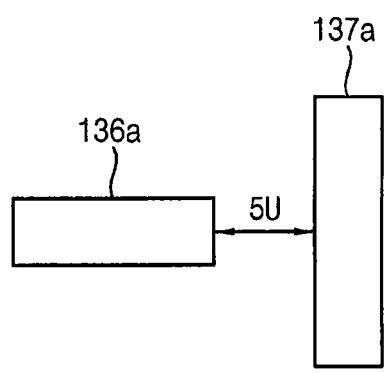

FIG. 6 shows an example embodiment of layout of the N−1-th test unit DUTN−1a. A fifth metal 136a is connected to the first node 122a. A sixth metal 137a is connected to the fifth node 130a. Distance between the fifth metal 136a and the sixth metal 137a is 5 U.

Figure 7:
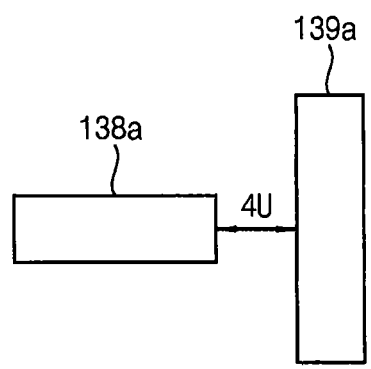

FIG. 7 shows an example embodiment of layout of the N-th test unit DUTNa. A seventh metal 138a is connected to the first node 122a. An eighth metal 139a is connected to the sixth node 131a. Distance between the seventh metal 137a and the eighth metal 139a is 4 U.

Referring to FIGS. 2, and 4 through 7, in an example embodiment, the fact that all of the first through N-th test units DUT1a, DUT2a through DUTN−1a, DUTNa are opened may be indicated by one test when the first row signal RS1 is activated, activated row test enable signal RTS is applied to the row test controller 160, the input current is applied as the first test signal TS1, and the input current is not measured as the second test signal TS2. In this case, the fact that minimum distance between metals in the design rule is equal to or smaller than 4 U may be indicated, and it is not required to separately perform short test of each of the first through N-th test units DUT1a, DUT2a through DUTN−1a, DUTNa again.

In another example embodiment, the fact that not all of the first through N-th test units DUT1a, DUT2a through DUTN−1a, DUTNa are opened may be indicated when the first row signal RS1 is activated, activated row test enable signal RTS is applied to the row test controller 160, the input current is applied as the first test signal TS1, and the input current is measured as the second test signal TS2. In this case, the test circuit 110 separately performs short test of each of the first through N-th test units DUT1a, DUT2a through DUTN−1a, DUTNa again by deactivating the row test enable signal RTS, activating the first through N-th column output signals COS1, COS2 through COSN−1, COSN sequentially. After short tests are performed again, the fact that the minimum distance between metals in the design rules is 5 U may be indicated when two terminals of the N−1-th test unit DUTN−1a are disconnected and two terminals of the N-th test unit DUTNa are connected.

Figure 8:
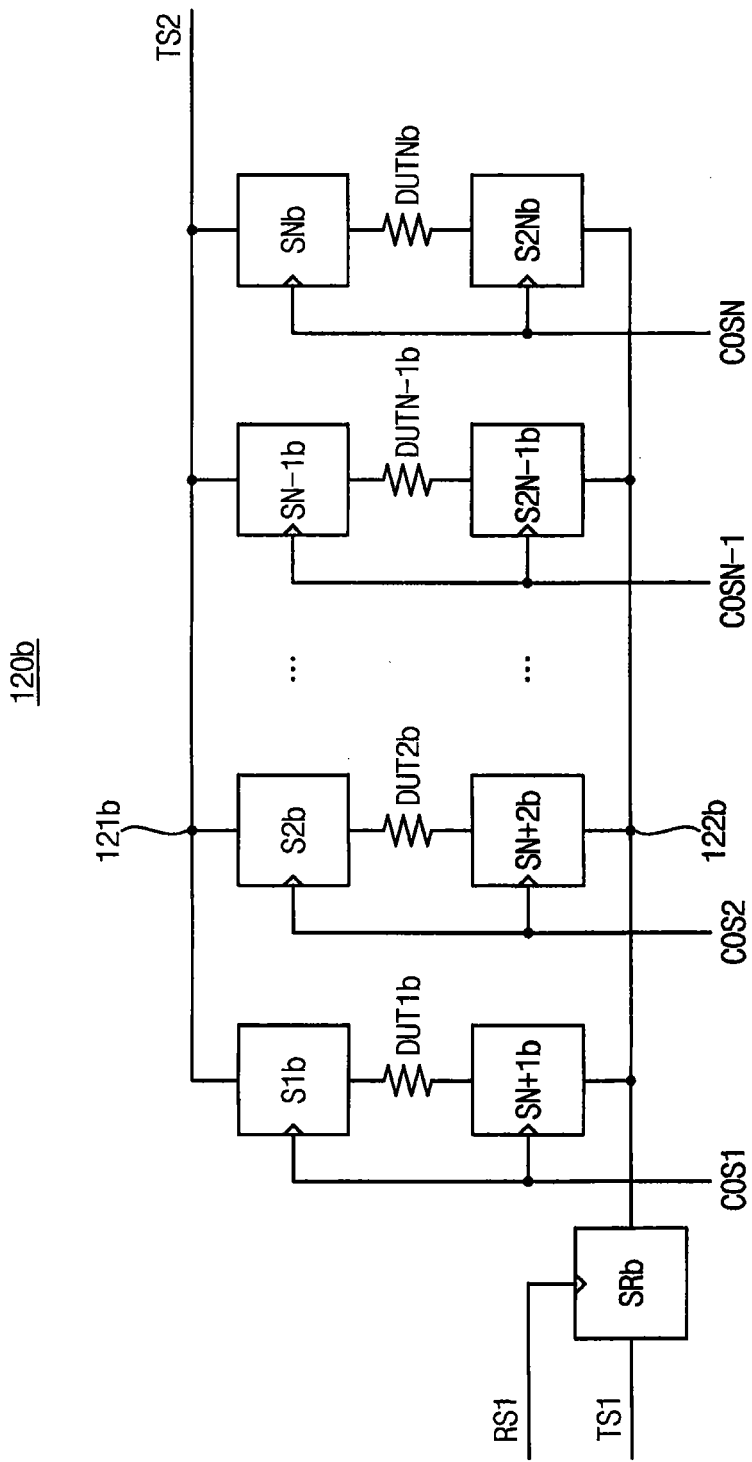
FIG. 8 is a block diagram illustrating the first row test block included in the test system of FIG. 1.

FIG. 8 is a block diagram illustrating the first row test block included in the test system of FIG. 1.

Referring to FIG. 8, the first row test block 120b may include a row switch SRb, and the first through 2N-th column switches S1b, S2b through SN−1b, SNb, SN+1b, SN+2b through S2N−1b, and S2Nb. The second through M-th row test blocks RTC2, RTCM−1, RTCM included in the test system 100 of FIG. 1 may have the same or similar structure with the first row test block 120b.

The first test signal TS1 may be applied to a first terminal of the row switch SRb. A second terminal of the row switch SRb may be connected to a first node 122b. The first and second terminals of the row switch SRb may be connected or disconnected based on the first row signal RS1. The second test signal TS2 may be output from a second node 121b. First terminals of the first through N-th column switches S1b, S2b through SN−1b, SNb may be connected to the second node 122b. Second terminals of the first through N-th column switches S1b, S2b through SN−1b, SNb may be connected to first terminals of the N+1-th through 2N-th column switches SN+1a, SN+2a through S2N−1a, S2Nb through the first through N-th test units DUT1b, DUT2b through DUTN−1b, DUTNb respectively. Second terminals of the N+1-th through 2N-th column switches SN+1a, SN+2a through S2N−1a, S2Nb may be connected to the first node 122b. The first and second terminals of each of the first through N-th column switches S1b, S2b through SN−1b, SNb may be connected or disconnected based on each of the first through N-th column output signals COS1, COS2 through COSN−1, COSN, and the first and second terminals of each of the N+1-th through 2N-th column switches SN+1a, SN+2a through S2N−1a, S2Nb may be connected or disconnected based on each of the first through N-th column output signals COS1, COS2 through COSN−1, COSN.

Operation of the first row test block 120b may be understood based on the reference to FIG. 2.

Figure 9:
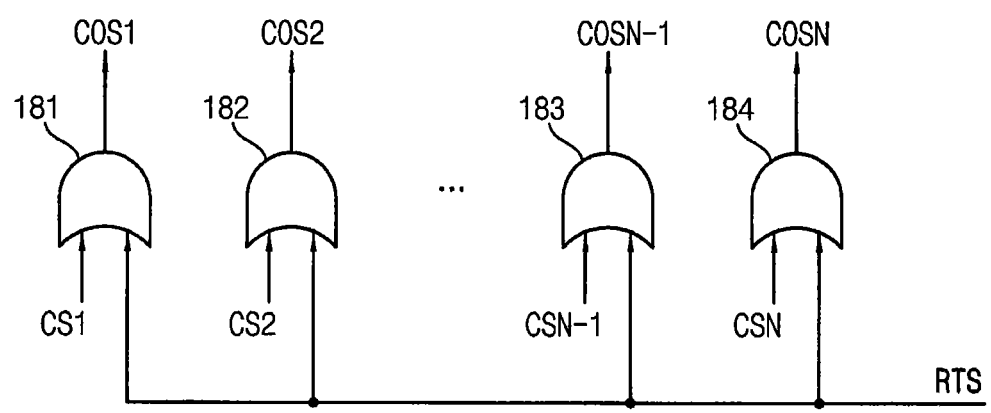
FIG. 9 is a block diagram illustrating a row test controller included in the test system of FIG. 1.

FIG. 9 is a block diagram illustrating a row test controller included in the test system of FIG. 1.

Referring to FIG. 9, the row test controller 160 may include first through N-th OR gates 181, 182, 183 through 184. The first OR gate 181 may generate the first column output signal COS1 by performing logic OR operation on the row test enable signal RTS and the first column signal CS1. The second OR gate 182 may generate the second column output signal COS2 by performing logic OR operation on the row test enable signal RTS and the second column signal CS2. The N−1-th OR gate 183 may generate the N−1-th column output signal COSN−1 by performing logic OR operation on the row test enable signal RTS and the N−1-th column signal CSN−1. The N-th OR gate 184 may generate the N−1-th column output signal COSN by performing logic OR operation on the row test enable signal RTS and the N-th column signal CSN.

Figure 10:
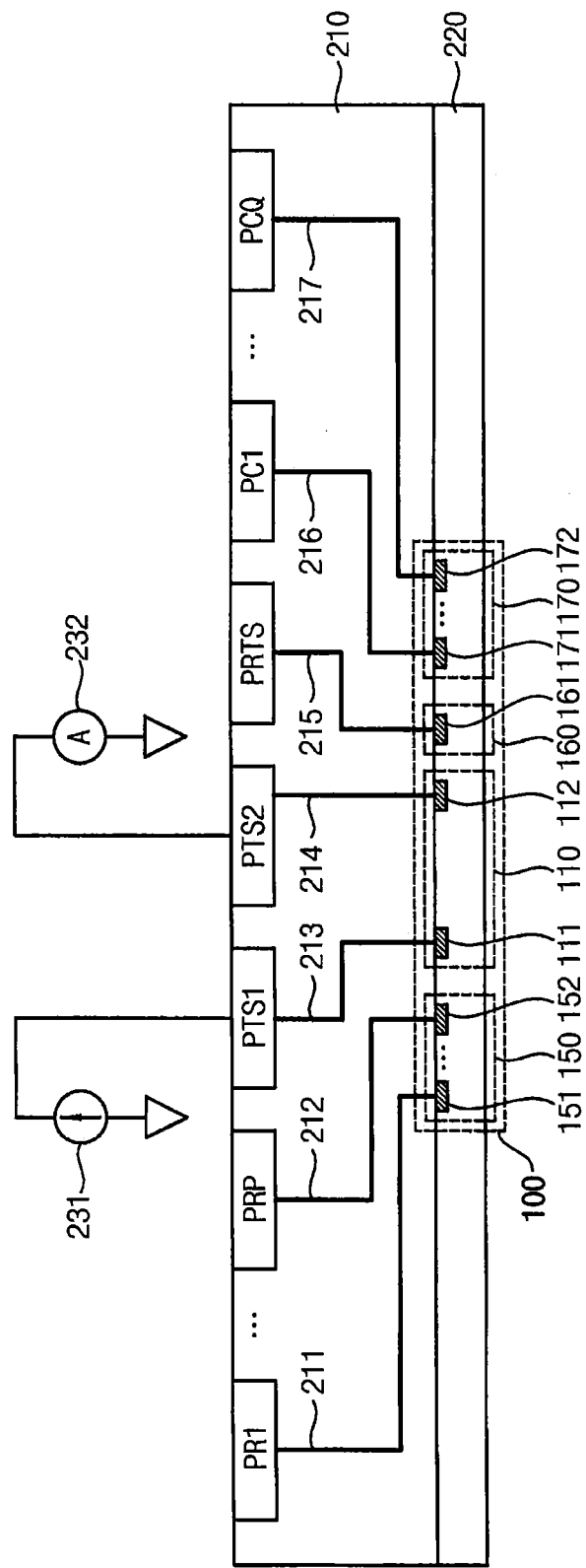
FIG. 10 is a sectional view of a test system according to an example embodiment.

FIG. 10 is a sectional view of a test system according to an example embodiment.

Referring to FIG. 10, the test system 100 of FIG. 1 may be implemented on a silicon substrate 220. The test system 100 may include a plurality of row input signal metals 151, 152, first and second test signal metals 111, 112, row test enable signal metal 161, and a plurality of column input signal metals 171, 172 on a surface of the silicon substrate 220.

An insulation layer 210 may be formed to be stacked on the silicon substrate 220. The insulation layer 210 may include a plurality of row input signal pads PR1, PRP, first and second test signal pads PTS1, PTS2, a row test enable signal pad PRTS, and a plurality of column input signal pads PC1, PCQ on a surface of the insulation layer 220. The insulation layer 220 may include first connection metals 211, 212 connecting the row input signal pads PR1, PRP and the row input signal metals 151, 152 respectively. The insulation layer 220 may include a second connection metal 213 connecting the first test signal pad PTS1 and the first test signal metal 111. The insulation layer 220 may include a third connection metal 214 connecting the second test signal pad PTS2 and the second test signal metal 112. The insulation layer 220 may include a fourth connection metal 215 connecting the row test enable signal pad PRTS and the row test enable signal metal 161. The insulation layer 220 may include fifth connection metals 216, 217 connecting the column input signal pads PC1, PCQ and the column input signal metals 171, 172.

The row input signals RIS1, RISP may be provided to the row decoder 150 through the row input signal pads PR1, PRP, the first connection metals 211, 212, and the row input signal metals 151, 152, respectively. The column input signals CIS1, CISQ may be provided to the column decoder 170 through the column input signal pads PC1, PCQ, the fifth connection metals 216, 217, and the column input signal metals 171, 172, respectively. The row test enable signal RTS may be provided to the row test controller 160 through the row test enable signal pad PRTS, the fourth connection metal 215, and the row test enable signal metal 161. The first test signal TS1 generated by an external current source 231 may be provided to the test circuit 110 through the first test signal pad PTS1, the second connection metal 213, and the first test signal metal 111. The second test signal TS2 generated by the test circuit 110 may be provided to an external current measurement circuit 232 through the second test signal metal 112, the third connection metal 214, and the second test signal pad PTS2.

Figure 11:
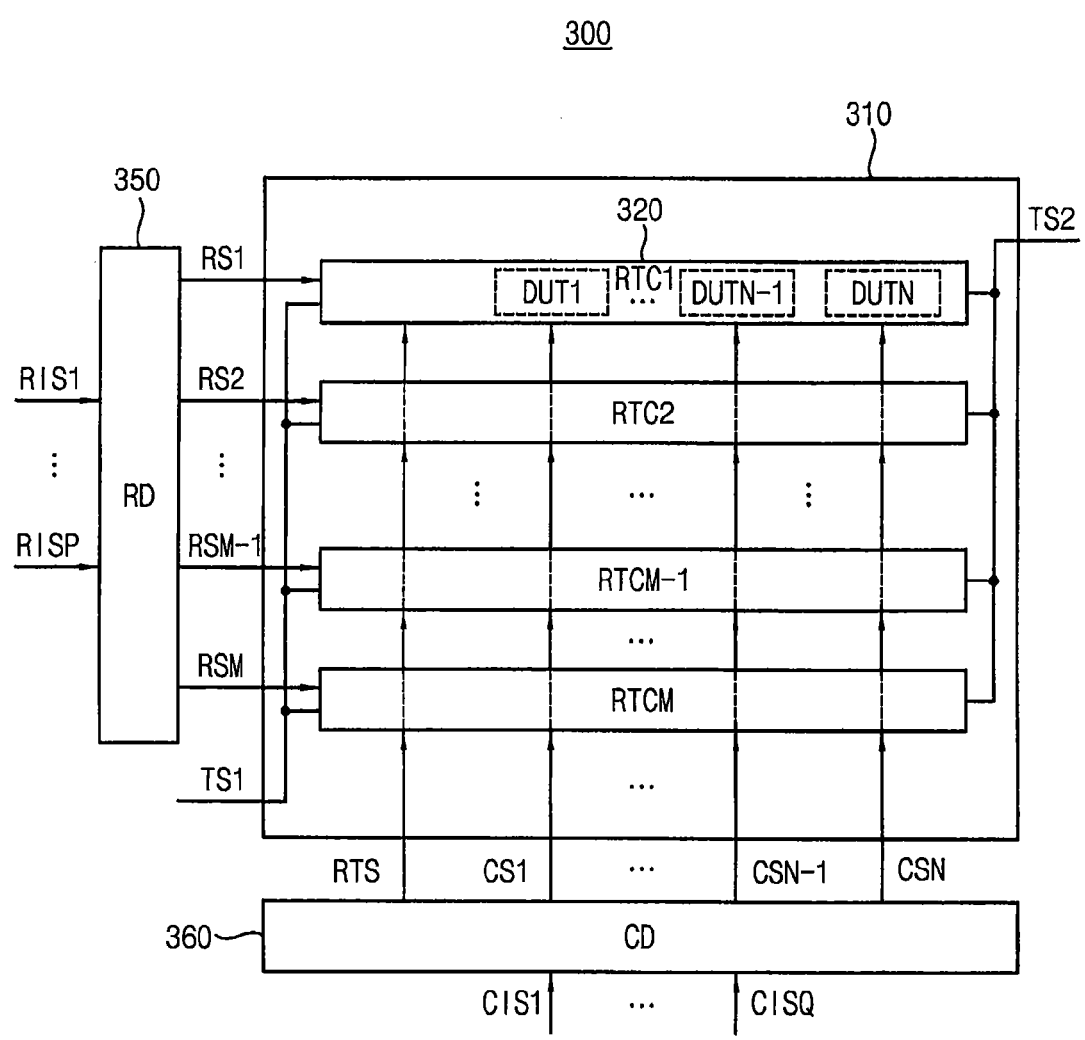
FIG. 11 is a block diagram illustrating a test system according to another example embodiment.

FIG. 11 is a block diagram illustrating a test system according to another example embodiment.

Referring to FIG. 11, a test system 300 includes a row decoder 350, a column decoder 360, and a test circuit 310. The row decoder 350 activates one of first through M-th row signals RS1, RS2 through RSM−1, RSM based on a plurality of row input signals RIS1 through RISP. M is a positive integer. The column decoder 360 activates one of signals, which includes a row test enable signal RTS and first through N-th column signals CS1 through CSN−1, CSN, based on a plurality of column input signals CIS1 through CISQ. N is a positive integer. The test circuit 310 includes first through M-th row test blocks RTC1(320), RTC2 through RTCM−1, RTCM, each of which includes first through N-th test units DUT1 through DUTN−1, DUTN. The first through M-th row test blocks RTC1, RTC2 through RTCM−1, RTCM correspond to the first through M-th row signals RS1, RS2 through RSM−1, RSM, respectively. The test circuit 310 simultaneously performs open test of the first through N-th test units included in a row test block, which corresponds to activated row signal among the first through M-th row signals RS1, RS2 through RSM−1, RSM, based on first and second test signals TS1, TS2 and the first through N-th column signals CS1 through CSN−1, CSN when the row test enable signal RTS is activated.

The test circuit 310 may perform open test of a test unit, which corresponds to the activated row signal among the first through M-th row signals RS1, RS2 through RSM−1, RSM and activated column signal among the first through N-th column signals CS1 through CSN−1, CSN, based on the first and second test signals TS1, TS2 when the row test enable signal RTS is deactivated.

A procedure of simultaneous open test of the first through N-th test units DUT1, DUT2 through DUTN−1, DUTN and a procedure of separate open test of the first through N-th test units DUT1, DUT2 through DUTN−1, DUTN will be described with the reference to FIG. 12.

Figure 12:
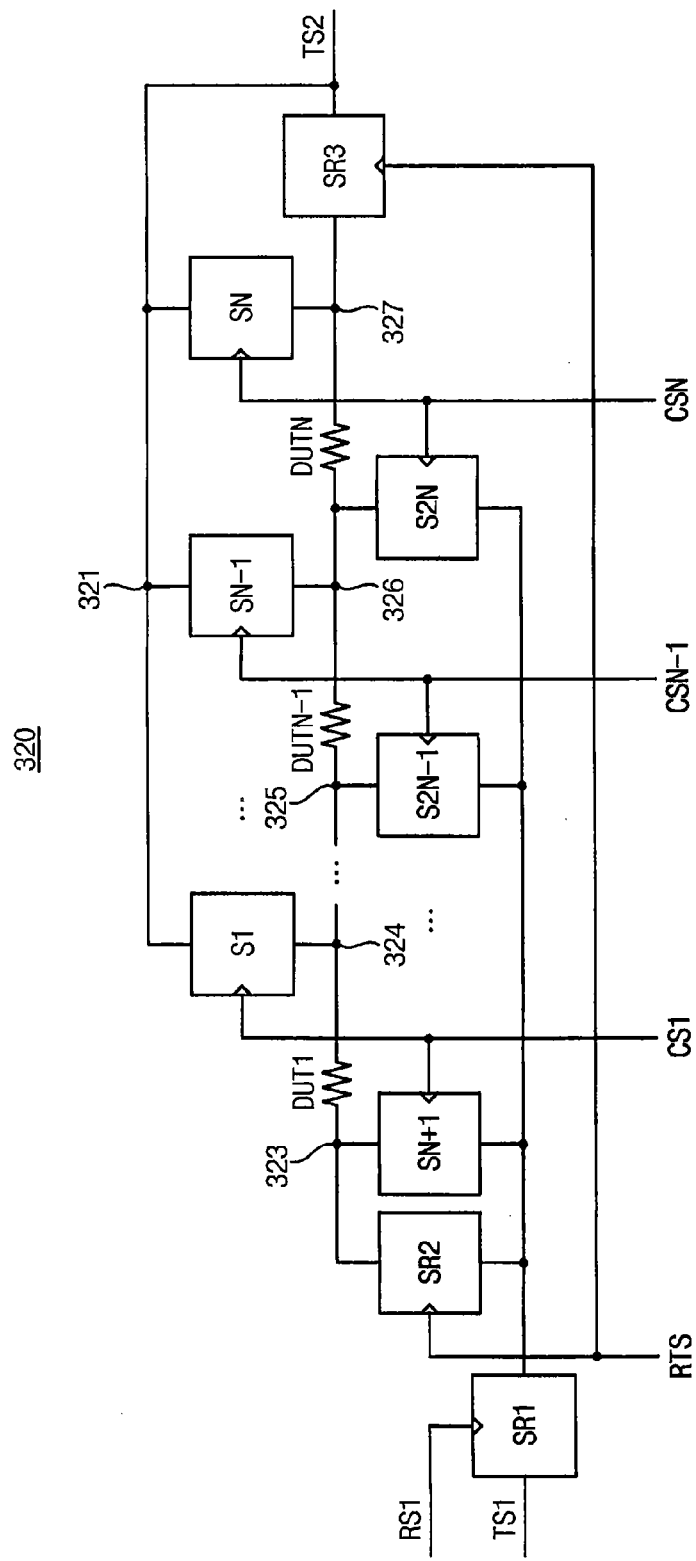
FIG. 12 is a block diagram illustrating the first row test block included in the test system of FIG. 11.

FIG. 12 is a block diagram illustrating the first row test block included in the test system of FIG. 11.

Referring to FIG. 12, the first row test block 320 may include first through third row switches SR1, SR2, and SR3, and first through 2N-th column switches S1 through SN−1, SN, SN+1 through S2N−1, S2N. The second through M-th row test blocks RTC2, RTCM−1, RTCM included in the test system 300 of FIG. 11 may have the same or similar structure with the first row test block 320.

The first test signal TS1 may be applied to a first terminal of the first row switch SR1. A second terminal of the first row switch SR1 may be connected to a first node 322. The first and second terminals of the first row switch SR1 may be connected or disconnected based on the first row signal RS1. A first terminal of the L+1-th test unit may be connected to a second terminal of the L-th test unit. L is a positive integer less than N. In other words, the second terminal of the first test unit DUT1 may be connected to the first terminal of the second test unit through a fourth node 324, and the second terminal of the N−1-th test unit DUTN−1 may be connected to the first terminal of the N-th test unit DUTN through a sixth node 326. A first terminal of the second row switch SR2 may be connected to the first node 322. A second terminal of the second row switch SR2 may be connected to a first terminal of the first test unit DUT1 through a third node 323. The first and second terminals of the second row switch SR2 may be connected or disconnected based on the row test enable signal RTS. A first terminal of the third row switch SR3 may be connected to a second terminal of the N-th test unit DUTN through a seventh node 327. A second terminal of the third row switch SR3 may be connected to a second node 321. The second test signal TS2 may be output from the second node 321. The first and second terminals of the third row switch SR3 may be connected or disconnected based on the row test enable signal RTS. First terminals of the first through N-th column switches S1 through SN−1, SN may be connected to the second node 321. Second terminals of the first through N-th column switches S1 through SN−1, SN may be connected to the second terminals of the first through N-th test units DUT1 through DUTN−1, DUTN respectively. The first and second terminals of each of the first through N-th column switches S1 through SN−1, SN may be connected or disconnected based on each of the first through N-th column signal CS1 through CSN−1, CSN. First terminals of the N+1-th through 2N-th column switches SN+1 through S2N−1, S2N may be connected to the first node 322. Second terminals of the N+1-th through 2N-th column switches SN+1 through S2N−1, S2N are connected to the first terminals of the first through N-th test units DUT1 through DUTN−1, DUTN respectively. The first and second terminals of each of the N+1-th through 2N-th column switches SN+1 through S2N−1, S2N are connected or disconnected based on each of the first through N-th column signal CS1 through CSN−1, CSN.

The first and second terminals of the first row switch SR1 may be connected (shorted) when the first row signal RS1 is activated. The first and second terminals of the first row switches SR1 may be disconnected (opened) when the first row signal RS1 is deactivated. The first and second terminals of the second row switch SR2 may be connected when the row test enable signal RTS is activated. The first and second terminals of the second row switches SR2 may be disconnected when the row test enable signal RTS is deactivated. The first and second terminals of the third row switch SR3 may be connected when the row test enable signal RTS is activated. The first and second terminals of the third row switches SR3 may be disconnected when the row test enable signal RTS is deactivated. The first and second terminals of each of the first through 2N-th column switches S1 through SN−1, SN, SN+1 through S2N−1, S2N are connected when each of the first through N-th column signal CS1 through CSN−1, CSN is activated. The first and second terminals of each of the first through 2N-th column switches S1 through SN−1, SN, SN+1 through S2N−1, S2N are disconnected when each of the first through N-th column signal CS1 through CSN−1, CSN is deactivated.

In an example embodiment, the first through N-th test units DUT1, DUTN−1 through DUTN may have the same circuit structure, but may have different layout patterns. Example embodiments of layouts of the first through N-th test units DUT1, DUTN−1 through DUTN will be described with the references to FIGS. 13 through 15

Two terminals of the first row switch SR1 are connected, two terminals of the second row switches SR2 are connected, and two terminals of the third row switches SR3 are connected when the first row signal RS1 is activated and the row test enable signal RTS is activated. Because the row test enable signal RTS is activated, the first through N-th column signals CS1 through CSN−1, CSN are deactivated and two terminals of each of the first through 2N-th column switches S1 through SN−1, SN, SN+1 through S2N−1, S2N are disconnected. If the input current is applied as the first test signal TS1 and the input current is measured as the second test signal TS2, two terminals of every first through N-th test units DUT1 through DUTN−1, DUTN are connected and the result of the open test of the first through N-th test units DUT1 through DUTN−1, DUTN represents success. In other words, the fact that all of the first through N-th test units DUT1 through DUTN−1, DUTN are shorted may be indicated by one test.

If the input current is applied as the first test signal TS1 and the input current is not measured as the second test signal TS2, two terminals of at least one of the first through N-th test units DUT1 through DUTN−1, DUTN is disconnected and the result of the open test of the first through N-th test units DUT1 through DUTN−1, DUTN represents failure. In other words, the fact that not all of the first through N-th test units DUT1 through DUTN−1, DUTN are shorted may be indicated. In this case, the test circuit 310 separately performs open test of each of the first through N-th test units DUT1, DUTN−1 through DUTN again by deactivating the row test enable signal RTS, activating the first through N-th column signals CS1 through CSN−1, CSN sequentially.

Two terminals of the first row switch SR1 are connected, two terminals of the first column switch S1 are connected, and two terminals of the N+1-th column switch SN+1 are connected, two terminals of the second row switch SR2 are disconnected, two terminals of the third row switch SR3 are disconnected, and two terminals of each of other column switches SN−1, SN, S2N−1, and S2N are disconnected when the first row signal RS1 is activated, the row test enable signal RTS is deactivated, the first column signal CS1 is activated, and other column signals CSN−1, CSN are deactivated. If the input current is applied as the first test signal TS1 and the input current is measured as the second test signal TS2, two terminals of the first test unit DUT1*a* are connected. If the input current is applied as the first test signal TS1 and the input current is not measured as the second test signal TS2, two terminals of the first test unit DUT1*a* are disconnected.

Two terminals of the first row switch SR1 are connected, two terminals of the N−1-th column switch SN−1 are connected, and two terminals of the 2N−1-th column switch S2N−1 are connected, two terminals of the second row switch SR2 are disconnected, two terminals of the third row switch SR3 are disconnected, and two terminals of each of other column switches S1, SN, SN+1, and S2N are disconnected when the first row signal RS1 is activated, the row test enable signal RTS is deactivated, the N−1-th column signal CSN−1 is activated, and other column signals CS1, CSN are deactivated. If the input current is applied as the first test signal TS1 and the input current is measured as the second test signal TS2, two terminals of the N−1-th test unit DUTN−1 are connected. If the input current is applied as the first test signal TS1 and the input current is not measured as the second test signal TS2, two terminals of the N−1-th test unit DUTN−1 are disconnected.

Two terminals of the first row switch SR1 are connected, two terminals of the N-th column switch SN are connected, and two terminals of the 2N-th column switch S2N are connected, two terminals of the second row switch SR2 are disconnected, two terminals of the third row switch SR3 are disconnected, and two terminals of each of other column switches S1, SN−1, SN+1, and S2N−1 are disconnected when the first row signal RS1 is activated, the row test enable signal RTS is deactivated, the N-th column signal CSN is activated, and other column signals CS1, CSN−1 are deactivated. If the input current is applied as the first test signal TS1 and the input current is measured as the second test signal TS2, two terminals of the N-th test unit DUTN are connected. If the input current is applied as the first test signal TS1 and the input current is not measured as the second test signal TS2, two terminals of the N-th test unit DUTN are disconnected.

Figure 13:
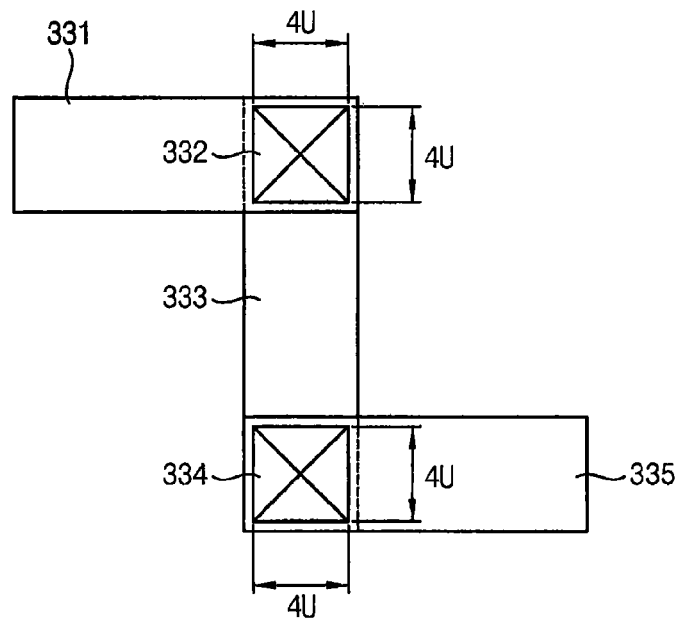
FIGS. 13 through 15 are diagrams illustrating example embodiments of layouts of the first, N–1-th, and N-th test units included in the first row test block of FIG. 12.
Figure 14:
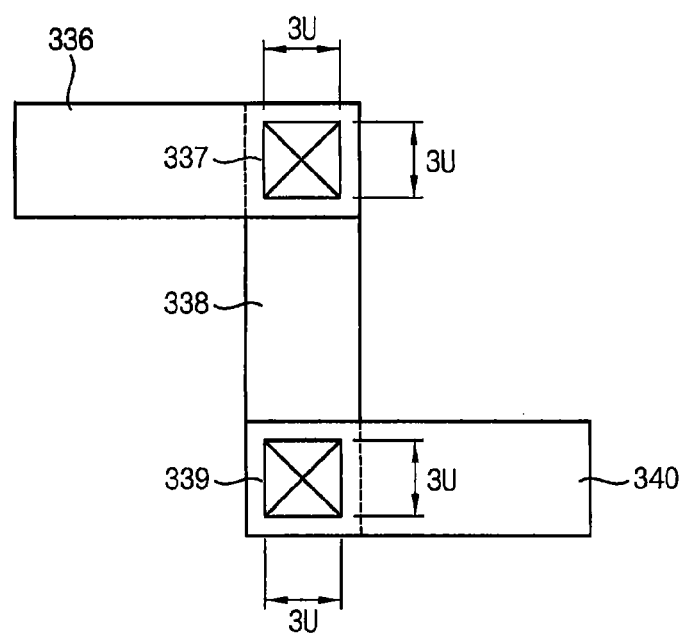
Figure 15:
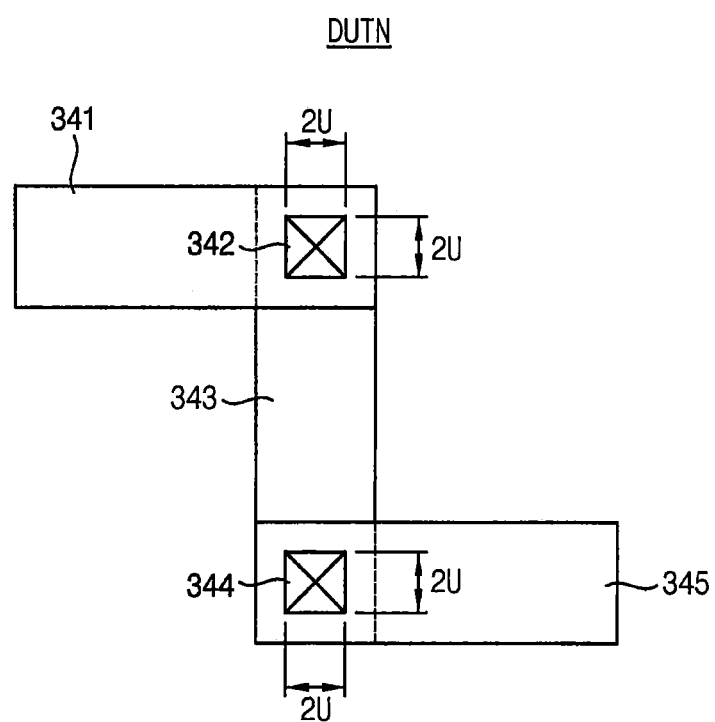

FIGS. 13 through 15 are diagrams illustrating example embodiments of layouts of the first, N−1-th, and N-th test units included in the first row test block of FIG. 12. These layouts show the same layout pattern, but have different design rules among the layout pattern.

FIG. 13 shows an example embodiment of layout of the first test unit DUT1. A first metal 331, which is the first terminal of the first test unit DUT1, is connected to the third node 323. A third metal 335, which is the second terminal of the first test unit DUT1, is connected to the fourth node 324. A second metal 333 is connected to the first metal 331 through a first contact 332. The second metal 333 is connected to the third metal 335 through a second contact 334. Each of the first contact 332 and the second contact 334 has a size of 4 U*4 U.

FIG. 14 shows an example embodiment of layout of the N−1-th test unit DUTN−1. A fourth metal 336, which is the first terminal of the N−1-th test unit DUTN−1, is connected to the fifth node 325. A sixth metal 340, which is the second terminal of the N−1-th test unit DUTN−1, is connected to the sixth node 326. A fifth metal 338 is connected to the fourth metal 336 through a third contact 337. The fifth metal 338 is connected to the sixth metal 340 through a fourth contact 339. Each of the third contact 337 and the fourth contact 339 has a size of 3 U*3 U.

FIG. 15 shows an example embodiment of layout of the N-th test unit DUTN. A seventh metal 341, which is the first terminal of the N-th test unit DUTN, is connected to the sixth node 326. A ninth metal 345, which is the second terminal of the N-th test unit DUTN, is connected to the seventh node 327. An eighth metal 343 is connected to the seventh metal 341 through a fifth contact 342. The eighth metal 343 is connected to the ninth metal 345 through a sixth contact 344. Each of the fifth contact 342 and the sixth contact 344 has a size of 2 U*2 U.

Referring to FIGS. 12 through 15, in an example embodiment, the fact that all of the first through N-th test units DUT1 through DUTN−1, DUTN are shorted may be indicated by one test when the first row signal RS1 is activated, the row test enable signal RTS is activated, the input current is applied as the first test signal TS1, and the input current is measured as the second test signal TS2. In this case, the fact that minimum size of contact in the design rule is equal to or smaller than 2 U*2 U may be indicated, and it is not required to separately perform open test of each of the first through N-th test units DUT1 through DUTN−1, DUTN again.

In another example embodiment, the fact that not all of the first through N-th test units DUT1 through DUTN−1, DUTN are shorted may be indicated when the first row signal RS1 is activated, the row test enable signal RTS is activated, the input current is applied as the first test signal TS1, and the input current is not measured as the second test signal TS2. In this case, the test circuit 310 separately performs open test of each of the first through N-th test units DUT1 through DUTN−1, DUTN again by deactivating the row test enable signal RTS, activating the first through N-th column signals CS1 through CSN−1, CSN sequentially. After open tests are performed again, the fact that the minimum size of contact in the design rules is 3 U*3 U may be indicated when two terminals of the N−1-th test unit DUTN−1 are connected and two terminals of the N-th test unit DUTN are disconnected.

Figure 16:
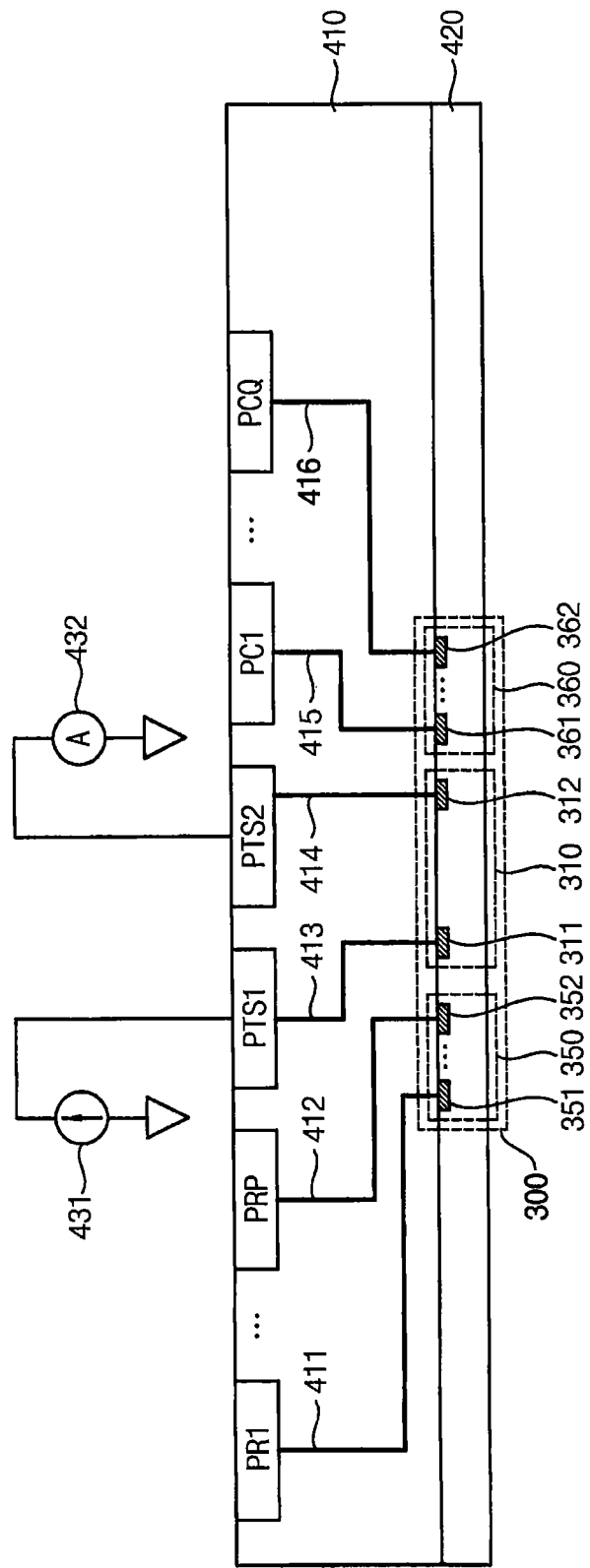
FIG. 16 is a sectional view of an example embodiment implementing the test system of FIG. 11.

FIG. 16 is a sectional view of an example embodiment implementing the test system of FIG. 11.

Referring to FIG. 16, the test system 300 of FIG. 11 may be implemented on a silicon substrate 420. The test system 300 may include a plurality of row input signal metals 351, 352, first and second test signal metals 311, 312, and a plurality of column input signal metals 361, 362 on a surface of the silicon substrate 420.

An insulation layer 410 may be formed to be stacked on the silicon substrate 420. The insulation layer 410 may include a plurality of row input signal pads PR1, PRP, first and second test signal pads PTS1, PTS2, and a plurality of column input signal pads PC1, PCQ on a surface of the insulation layer 410. The insulation layer 410 may include first connection metals 411, 412 connecting the row input signal pads PR1, PRP and the row input signal metals 351, 352 respectively. The insulation layer 410 may include a second connection metal 413 connecting the first test signal pad PTS1 and the first test signal metal 311. The insulation layer 410 may include a third connection metal 414 connecting the second test signal pad PTS2 and the second test signal metal 312. The insulation layer 410 may include fourth connection metals 415, 416 connecting the column input signal pads PC1, PCQ and the column input signal metals 361, 362.

The row input signals RIS1, RISP may be provided to the row decoder 350 through the row input signal pads PR1, PRP, the first connection metals 411, 412, and the row input signal metals 351, 352, respectively. The column input signals CIS1, CISQ may be provided to the column decoder 360 through the column input signal pads PC1, PCQ, the fourth connection metals 415, 416, and the column input signal metals 361, 362, respectively. The first test signal TS1 generated by an external current source 431 may be provided to the test circuit 310 through the first test signal pad PTS1, the second connection metal 413, and the first test signal metal 311. The second test signal TS2 generated by the test circuit 310 may be provided to an external current measurement circuit 432 through the second test signal metal 312, the third connection metal 414, and the second test signal pad PTS2.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A test system comprising:
a row decoder configured to activate one of first through M-th row signals, where M is a positive integer, based on a plurality of row input signals;
a column decoder configured to activate one of first through N-th column signals, where N is a positive integer, based on a plurality of column input signals;
a row test controller configured to output first through N-th column output signals, which are activated, when a row test enable signal is activated and output the first through N-th column signals as the first through N-th column output signals respectively when the row test enable signal is deactivated; and
a test circuit including first through M-th row test blocks, each of which includes first through N-th test units, wherein the first through M-th row test blocks correspond to the first through M-th row signals, respectively, and wherein the test circuit simultaneously performs a short test of the first through N-th test units included in a row test block, which corresponds to activated row signal among the first through M-th row signals, based on first and second test signals and the first through N-th column output signals when the row test enable signal is activated.

2. The test system of claim 1, wherein the test circuit performs the short test of a test unit, which corresponds to the activated row signal among the first through M-th row signals and activated column output signal among the first through N-th column output signals, based on the first and second test signals when the row test enable signal is deactivated.

3. The test system of claim 1, wherein a result of the short test of the first through N-th test units represents success when an input current is applied as the first test signal and the input current is not measured as the second test signal,
wherein the result of the short test of the first through N-th test units represents failure when the input current is applied as the first test signal and the input current is measured as the second test signal.

4. The test system of claim 3, wherein if the result of the short test of the first through N-th test units represents failure, the row test enable signal is deactivated and the test circuit separately performs the short test of each of the first through N-th test units included in the row test block, which corresponds to the activated row signal among the first through M-th row signals, again.

5. The test system of claim 1, wherein the K-th row test block, where K is a positive integer equal to or less than M, includes a row switch and first through N-th column switches, wherein the first test signal is applied to a first terminal of the row switch, a second terminal of the row switch is connected to a first node, and the first and second terminals of the row switch are connected or disconnected based on the K-th row signal, and wherein the second test signal is output from a second node, first terminals of the first through N-th column switches are connected to the second node, second terminals of the first through N-th column switches are connected to the first node through the first through N-th test units respectively, and the first and second terminals of each of the first through N-th column switches are connected or disconnected based on each of the first through N-th column output signals.

6. The test system of claim 1, wherein the K-th row test block, where K is a positive integer equal to or less than M, includes a row switch and first through 2N-th column switches, wherein the first test signal is applied to a first terminal of the row switch, a second terminal of the row switch is connected to a first node, and the first and second terminals of the row switch are connected or disconnected based on the K-th row signal, and wherein the second test signal is output from a second node, first terminals of the first through N-th column switches are connected to the second node, second terminals of the first through N-th column switches are connected to first terminals of the N+1-th through 2N-th column switches through the first through N-th test units respectively, second terminals of the N+1-th through 2N-th column switches are connected to the first node, the first and second terminals of each of the first through N-th column switches are connected or disconnected based on each of the first through N-th column output signals, and the first and second terminals of each of the N+1-th through 2N-th column switches are connected or disconnected based on each of the first through N-th column output signals.

7. The test system of claim 1, wherein the test system is embodied on a silicon substrate, and wherein the test system includes a plurality of row input signal metals, first and second test signal metals, row test enable signal metal, and a plurality of column input signal metals on the silicon substrate.

8. The test system of claim 7 further comprising an insulation layer on the silicon substrate, wherein the insulation layer includes a plurality of row input signal pads, first and second test signal pads, a row test enable signal pad, and a plurality of column input signal pads on the insulation layer, wherein the insulation layer includes first connection metals connecting the row input signal pads and the row input signal metals respectively, a second connection metal connecting the first test signal pad and the first test signal metal, a third connection metal connecting the second test signal pad and the second test signal metal, a fourth connection metal connecting the row test enable signal pad and the row test enable signal metal, and fifth connection metals connecting the column input signal pads and the column input signal metals, wherein the row input signals are provided to the row decoder through the row input signal pads, the first connection metals, and the row input signal metals, respectively, wherein the column input signals are provided to the column decoder through the column input signal pads, the fifth connection metals, and the column input signal metals, respectively, wherein the row test enable signal is provided to the row test controller through the row test enable signal pad, the fourth connection metal, and the row test enable signal metal, wherein the first test signal generated by an external current source is provided to the test circuit through the first test signal pad, the second connection metal, and the first test signal metal, and wherein the second test signal generated by the test circuit is provided to an external current measurement circuit through the second test signal metal, the third connection metal, and the second test signal pad.

9. A test system comprising:

a row decoder configured to activate one of first through M-th row signals, where M is a positive integer, based on a plurality of row input signals;

a column decoder configured to activate one of first through N-th column signals, where N is a positive integer, based on a plurality of column input signals;

a test circuit including first through M-th row test blocks, each of which includes first through N-th test units;

wherein the first through M-th row test blocks correspond to the first through M-th row signals, respectively, and wherein the test circuit simultaneously performs a test of the first through N-th test units included in a row test block, which corresponds to activated row signal among the first through M-th row signals, based on first and second test signals and the first through N-th column output signals when the row test enable signal is activated.

10. The test system of claim 9 wherein the test is a short test that represents failure when a current is applied to a first node of the test unit and the current is measured at a second node of the test unit.

11. The test system of claim 9 wherein the test is an open test that represents failure when a current is applied to a first node of the test unit and the current is not measured at a second node of the test unit.

12. The test system of claim 9 wherein the test circuit is embodied on a single silicon substrate.

13. The test system of claim 12 wherein the plurality of test circuit comprises a plurality of layout patterns in the single silicon substrate, at least two of which include different design rules.

* * * * *